United States Patent
Tran et al.

(10) Patent No.: US 7,186,580 B2
(45) Date of Patent: Mar. 6, 2007

(54) LIGHT EMITTING DIODES (LEDS) WITH IMPROVED LIGHT EXTRACTION BY ROUGHENING

(75) Inventors: Chuong Anh Tran, Orange, CA (US); Trung Tri Doan, Los Gatos, CA (US)

(73) Assignee: Semileds Corporation, Milpitas, CA (US)

( * ) Notice: Subject to any disclaimer, the term of this patent is extended or adjusted under 35 U.S.C. 154(b) by 33 days.

(21) Appl. No.: 11/032,880

(22) Filed: Jan. 11, 2005

(65) Prior Publication Data
US 2006/0154391 A1 Jul. 13, 2006

(51) Int. Cl.
*H01L 21/66* (2006.01)
*H01L 33/00* (2006.01)
(52) U.S. Cl. .......................... 438/22; 438/29; 438/48; 257/88; 257/93; 257/98; 257/E21.125
(58) Field of Classification Search ............ 257/94–95; 438/22, 48
See application file for complete search history.

(56) References Cited

U.S. PATENT DOCUMENTS

| | | | |
|---|---|---|---|
| 3,954,534 A | 5/1976 | Scifres et al. | |
| 5,448,107 A | 9/1995 | Osada et al. | |
| 5,779,924 A | 7/1998 | Krames et al. | |
| 5,793,062 A | 8/1998 | Kish, Jr. et al. | |
| 6,023,413 A | 2/2000 | Umezawa | |
| 6,071,795 A | 6/2000 | Cheung et al. | |
| 6,161,910 A | 12/2000 | Reisenauer et al. | |
| 6,221,683 B1 | 4/2001 | Nirschl et al. | |
| 6,277,665 B1 | 8/2001 | Ma et al. | |
| 6,410,942 B1 * | 6/2002 | Thibeault et al. | ............. 257/88 |
| 6,429,460 B1 | 8/2002 | Chen et al. | |
| 6,455,930 B1 | 9/2002 | Palanisamy et al. | |
| 6,535,385 B2 | 3/2003 | Lee | |
| 6,561,261 B2 | 5/2003 | Wagner | |
| 6,614,172 B2 | 9/2003 | Chiu et al. | |
| 6,649,440 B1 | 11/2003 | Krames et al. | |
| 6,658,041 B2 | 12/2003 | Uebbing | |
| 6,713,862 B2 | 3/2004 | Palanisamy et al. | |
| 6,744,071 B2 | 6/2004 | Sano et al. | |
| 6,770,542 B2 | 8/2004 | Plossl et al. | |
| 6,800,500 B2 | 10/2004 | Coman et al. | |
| 6,821,804 B2 | 11/2004 | Thibeault et al. | |
| 6,828,529 B1 | 12/2004 | Wu | |

(Continued)

FOREIGN PATENT DOCUMENTS

WO  WO 2005/029572 A1  3/2005
WO  WO 2005/029573 A1  3/2005

OTHER PUBLICATIONS

Schnitzer, et al., "30% External Quantum Efficiency From Surface Textured, Thin-Film Light-Emitting Diodes," Appl. Phys. Lett. 63 (16), pp. 2174-2176, Oct. 18, 1993.

(Continued)

*Primary Examiner*—Dung A. Le
(74) *Attorney, Agent, or Firm*—Patterson & Sheridan, LLP

(57) ABSTRACT

Systems and methods are disclosed for fabricating a semiconductor light emitting diode (LED) device by forming an n-gallium nitride (n-GaN) layer on the LED device; and roughening the surface of the n-GaN layer to extract light from an interior of the LED device.

18 Claims, 3 Drawing Sheets

U.S. PATENT DOCUMENTS

2004/0135158 A1  7/2004   Schang-Jing Hon
2004/0245543 A1  12/2004  Myung Cheol Yoo
2006/0014310 A1* 1/2006   Epler et al. .................... 438/22
2006/0071225 A1* 4/2006   Beeson et al. ................. 257/98

OTHER PUBLICATIONS

Kock, et al., "Strongly Directional Emission From AlGaAs/GaAs Light-Emitting Diodes," Appl. Phys. Lett. 57, pp. 2327-2329, Nov. 26, 1990.

* cited by examiner

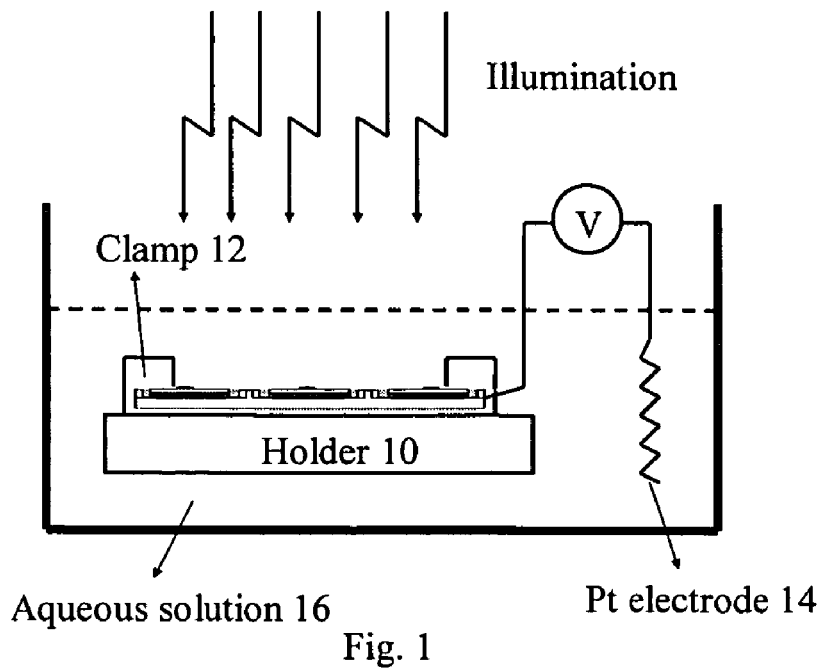
Fig. 1
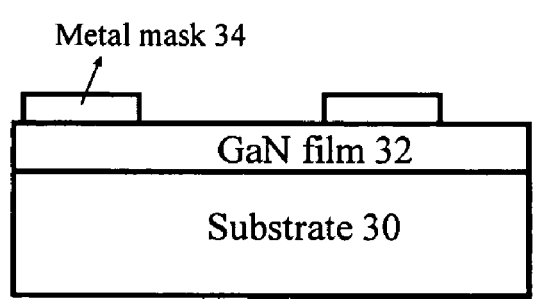
Fig. 2A
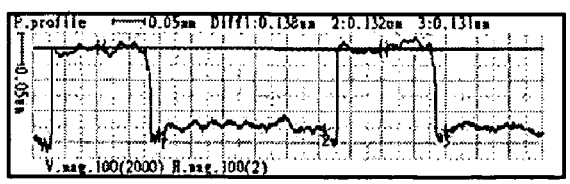
Fig. 2B, 200sec
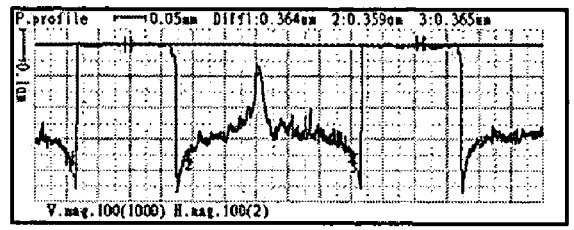
Fig. 2C, 400sec
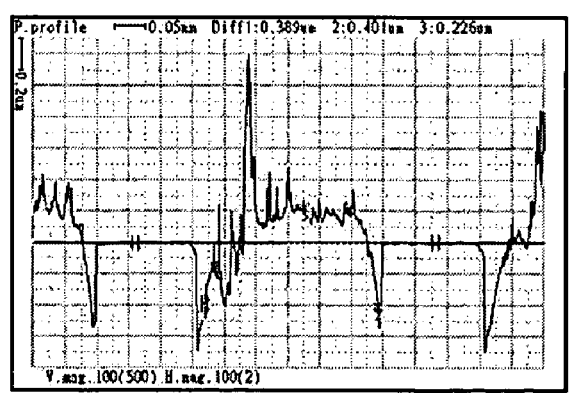
Fig. 2D, 600sec

LIGHT EMITTING DIODES (LEDS) WITH IMPROVED LIGHT EXTRACTION BY ROUGHENING

BACKGROUND

This invention relates to light emitting diodes and more particularly to new LED structures for enhancing their light extraction.

Light emitting diodes (LEDs) are an important class of solid state devices that convert electric energy to light. LEDs typically provide an active layer of semiconductor material sandwiched between two oppositely doped layers. When a bias is applied across the doped layers, holes and electrons are injected into the active layer where they recombine to generate light. The light generated by the active region emits in all directions and light escapes the semiconductor chip through all exposed surfaces.

As semiconductor materials have improved, the efficiency of semiconductor devices has also improved. New LEDs are being made from materials such as InAlGaN, which allows for efficient illumination in the ultraviolet to amber spectrum. Many of the new LEDs are more efficient at converting electrical energy to light compared to conventional lights and they can be more reliable. As LEDs improve, they are expected to replace conventional lights in many applications such as traffic signals, outdoor and indoor displays, automobile headlights and taillights, conventional indoor lighting, etc.

The efficiency of conventional LEDs is limited by their inability to emit all of the light that is generated by their active layer. When an LED is energized, light emitting from its active layer (in all directions) reaches the emitting surfaces at many different angles. Typical semiconductor materials have a high index of refraction ($n \approx 2.2$–$3.8$) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

One method of reducing the percentage of TIR light is to create light scattering centers in the form of random texturing on the LED's surface. The random texturing is patterned into the surface by using sub micron diameter polystyrene spheres on the LED surface as a mask during reactive ion etching. The textured surface has features on the order of the wavelength of light that refract and reflect light in a manner not predicted by Snell's law due to random interference effects. This approach has been shown to improve emission efficiency by 9 to 30%.

As discussed in U.S. Pat. No. 6,821,804, one disadvantage of surface texturing is that it can prevent effective current spreading in LEDs which have a poor electrical conductivity for the textured electrode layer, such as for p-type GaN. In smaller devices or devices with good electrical conductivity, current from the p and n-type layer contacts will spread throughout the respective layers. With larger devices or devices made from materials having poor electrical conductivity, the current cannot spread from the contacts throughout the layer. As a result, part of the active layer will not experience the current and will not emit light.

To create uniform current injection across the diode area, a spreading layer of conductive material can be deposited on the surface. However, this spreading layer often needs to be optically transparent so that light can transmit through the layer. When a random surface structure is introduced on the LED surface, an effectively thin and optically transparent current spreader cannot easily be deposited.

Another method of increasing light extraction from an LED is to include a periodic patterning of the emitting surface or internal interfaces which redirects the light from its internally trapped angle to defined modes determined by the shape and period of the surface. See U.S. Pat. No. 5,779,924 to Krames et al. This technique is a special case of a randomly textured surface in which the interference effect is no longer random and the surface couples light into particular modes or directions. One disadvantage of this approach is that the structure can be difficult to manufacture because the surface shape and pattern must be uniform and very small, on the order of a single wavelength of the LED's light. This pattern can also present difficulties in depositing an optically transparent current spreading layer as described above.

An increase in light extraction has also been realized by shaping the LED's emitting surface into a hemisphere with an emitting layer at the center. While this structure increases the amount of emitted light, its fabrication is difficult. U.S. Pat. No. 3,954,534 to Scifres and Burnham discloses a method of forming an array of LEDs with a respective hemisphere above each of the LEDs. The hemispheres are formed in a substrate and a diode array is grown over them. The diode and lens structure is then etched away from the substrate. One disadvantage of this method is that it is limited to formation of the structures at the substrate interface, and the lift off of the structure from the substrate results in increased manufacturing costs. Also, each hemisphere has an emitting layer directly above it, which requires precise manufacturing.

U.S. Pat. No. 5,431,766 discloses photoelectrochemical oxidation and dissolution of silicon (Si) in the absence of water and oxygen. Etch rates and photocurrents in an anhydrous HF-acetonitrile (MeCN) solution are directly proportional to light intensity up to at least 600 mW/cm2, producing a spatially selective etch rate of greater than 4 microns/min. Four electron transfer reactions per silicon molecule occur with a quantum yield greater than 3.3 due to electron injection from high energy reaction intermediates.

U.S. Pat. No. 5,793,062 discloses a structure for enhancing light extraction from an LED by including optically non-absorbing layers to redirect light away from absorbing regions such as contacts, and also to redirect light toward the LED's surface. One disadvantage of this structure is that the non-absorbing layers require the formation of undercut strait angle layers, which can be difficult to manufacture in many material systems.

U.S. Pat. No. 6,744,071 discloses a nitride semiconductor element having an opposed terminal structure, whose terminals face each other. The nitride semiconductor element includes a conductive layer, a first terminal, a nitride semiconductor with a light-emitting layer, and a second terminal, on a supporting substrate successively. The first terminal and a first insulating protect layer are interposed between the conductive layer and a first conductive type nitride semiconductor layer of the nitride semiconductor.

U.S. Pat. No. 6,821,804 discloses LEDs having light extraction structures on or within the LED to increase its efficiency. The new light extraction structures provide surfaces for reflecting, refracting or scattering light into directions that are more favorable for the light to escape into the package. The structures can be arrays of light extraction elements or disperser layers. The light extraction elements can have many different shapes and are placed in many locations to increase the efficiency of the LED over conventional LEDs. The disperser layers provide scattering centers for light and can be placed in many locations as well.

As further discussed in U.S. Pat. No. 6,821,804, another way to enhance light extraction is to couple photons into surface plasmon modes within a thin film metallic layer on the LED's emitting surface, which are emitted back into radiated modes. These structures rely on the coupling of photons emitted from the semiconductor into surface plasmons in the metallic layer, which are further coupled into photons that are finally extracted. One disadvantage of this device is that it is difficult to manufacture because the periodic structure is a one-dimensional ruled grating with shallow groove depths (<0.1.mu.m). Also, the overall external quantum efficiencies are low (1.4–1.5%), likely due to inefficiencies of photon to surface plasmon and surface plasmon-to-ambient photon conversion mechanisms. This structure also presents the same difficulties with a current spreading layer, as described above. Light extraction can also be improved by angling the LED chip's side surfaces to create an inverted truncated pyramid. The angled surfaces provide the TIR light trapped in the substrate material with an emitting surface. Using this approach external quantum efficiency has been shown to increase by 35% to 50% for the InGaAlP material system. This approach works for devices in which a significant amount of light is trapped in the substrate. For GaN devices grown on sapphire substrates, much of the light is trapped in the GaN film so that angling the LED chip's side surfaces will not provide the desired enhancement. Still another approach for enhancing light extraction is photon recycling. This method relies on LEDs having a high efficiency active layer that readily converts electrons and holes to light and vice versa. TIR light reflects off the LED's surface and strikes the active layer, where it is converted back to an electron-hole pair. Because of the high efficiency of the active layer, the electron-hole pair will almost immediately be reconverted to light that is again emitted in random directions. A percentage of the recycled light will strike one of the LEDs emitting surfaces within the critical angle and escape. Light that is reflected back to the active layer goes through the same process again.

SUMMARY

Systems and methods are disclosed for fabricating a semiconductor light emitting diode (LED) devices by forming an n-gallium nitride (n-GaN) layer on the LED device, and roughening the surface of the n-GaN layer to enhance light extraction from an interior of the LED device.

Implementations of the above system may include one or more of the following. The n-GaN layer of the LED wafer is roughened by photo-electrochemical oxidation and etching processes. The LED wafer includes a conductive substrate (such as Cu, W, Mo or their alloys); one or more epitaxial layers; one or more ohmic contact and reflective metal layers between the epitaxial layers and the conductive substrate (for example, Ni, Au, Pt, Cr, Ti, Pd, and Ag); a protection layer such as $SiO_2$, $Si_3N_4$, or SiON on the sidewalls of free standing LED; and n-type electrodes on the top n-GaN layer. The photo-electrochemical oxidation and etching process can be performed in a system with an aqueous solution; an illumination system; and an electrical biased system. The aqueous solution can be a combination of oxidizing agent and either acid or alkaline solutions. The oxidizing agent can be one or the combination of $H_2O_2$, $K_2S_2O_8$, among others. The acid solution can be one or more of $H_2SO_4$, HF, HCl, $H_3PO_4$, $HNO_3$, $CH_3COOH$. The alkaline solution can be one or the mixture of KOH, NaOH, $NH_4OH$, for example. The illumination can be performed by an Hg or Xe arc lamp system with wavelength ranging among visible and ultra-violet spectrum. The illumination is exposed on the n-type III-nitride semiconductors with an intensity less than 200 mW/cm². An electrical biased can be applied to the conductive substrate and the voltage is controlled between −10 and +10 V. The oxidation-dominant, the etching-dominant or the combined reactions can be controlled to optimize the roughness of the n-GaN surface by varying the constitution of the aqueous solution, the electrical biased, and the illumination intensity. The non-ordered textured morphology also is revealed after the roughening process.

The roughening process can be applied to the exposed n-GaN of the n-GaN up vertical LED at wafer-level. After the GaN-based LED epitaxial film is transferred to a conductive substrate, the n-type electrode (such as Cr/Ni) is formed on the n-type GaN layer. The n-type metal pads not only act as ohmic contacts but also the masks for the subsequent roughening process. The roughening process, which is performed by Photo-electrochemical (PEC) oxidation and etching method, follows the n-electrode metallization. The wafers are immersed into the aqueous solution under illumination and the conductive substrate is electrically biased. The aqueous solution is a combination of oxidizing agents and either acid or alkaline solutes. The roughened surface of n-type GaN would reveal non-ordered textured morphology that is unlike pyramids, cone-shaped, or semi-rounded morphologies. By varying the constitutions of solution, biased voltage, and the illumination intensity, the roughening mechanism can be controlled to oxidation-dominant or etch-dominant reaction. The RMS value of the surface roughness is controlled at 0.05 um to 2 microns. The roughened surface dimension is selected to optimally scatter light at approximately ½λ. In another implementation, the effective refractive index of the roughened surface is approximately 2.0~2.5.

Advantages of the roughened surface may include one or more of the following. The roughened surfaces create an effective rough surface on GaN to extract more light from interior. Compared with the LEDs with flat surfaces, the luminance of the LEDs with non-ordered textured surfaces can be enhanced by more than two times. The LEDs can provide more light for the same chip size/power consumption. Alternatively, the LEDs can be made smaller given the same light output requirement and such smaller size consumes less power as well as real estate, resulting in savings. The LEDs can be fabricated with standard processing techniques making them highly cost competitive with standard LEDs.

BRIEF DESCRIPTION OF THE FIGURES

FIG. 1 shows an exemplary system to perform a photo-electrochemical oxidation and etching process.

FIGS. 2A–2D show surface profiling diagrams of a first sample with metal masks under oxidation-dominant condition for various durations.

FIGS. 3A–3D show surface profiling diagrams of a second sample with metal masks under etching-dominant condition for various durations.

DESCRIPTION

Figure 3A:
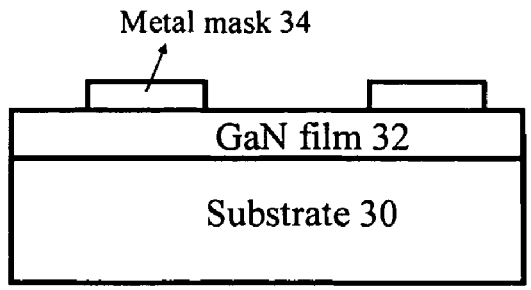

FIG. 1 shows an exemplary system to perform a photo-electrochemical (PEC) oxidation and etching process. The nature of the electrolytic solution is of particular importance in assuring high speed etch rates and in assuring an etch rate which is directly proportional to light intensity. The PEC etching process is carried out in a system shown in FIG. 1. In the system, light is projected by a light source onto the surface of an LED wafer resting above a holder 10 and secured by clamps 12, which is in contact with an electrolytic solution 16. The light intensity may be selectively varied to thereby selectively vary the rate of etching. The cell may have many geometric configurations and may be made of any suitable material for supporting the LED semiconductor wafer and for containing the electrolytic solution 16 having ions. The specific configuration of the cell may be optimized for high volume industrial applications. A reference electrode 14 such as a platinum electrode 14 extends into the electrolytic solution 16 through the cell body. The reference electrode 14 establishes a reference voltage $V_{ref}$ and is usually formed from a metal wire, such as a platinum or silver wire, for convenience, from a saturated calomel electrode (SCE), or from any other electrode mechanism.

The electrochemical reaction occurring in the cell is electrically powered and monitored by a potentiostat, which is well known in the art. The potentiostat comprises a current detector connected in series with a source voltage for applying a potential across the electrodes and a connection, which connects the potentiostat to the semiconductor wafer. The connection may be affixed to the semiconductor wafer via any bonding mechanism.

In the PEC etching process carried out in the system of FIG. 1, the semiconductor wafer is made part of an oxidation-reduction reaction. The semiconductor wafer is made the anode and a counter-electrode is made the cathode. A potential is applied to the semiconductor wafer. The reference electrode 14 is used in the process to measure and monitor the potential. Etching results from a decomposition reaction induced by photogenerated holes at the interface between the semiconductor wafer and the electrolytic solution 16.

FIG. 2A shows surface profiling diagrams of a first sample with metal masks under oxidation-dominant condition for various durations. The sample wafer includes a substrate 30, a GaN film 32 and a metal mask 34 with roughened surfaces. The surface profiling diagrams of a sample with metal masks under oxidation-dominant condition for 200 seconds in FIG. 2B, 400 seconds in FIG. 2C and 600 seconds in FIG. 2D.

FIG. 3 shows surface profiling diagrams of a second sample with metal masks under etching-dominant condition for various durations. The sample wafer includes a substrate 30, a GaN film 32 and a metal mask 34 with roughened surfaces. The surface profiling diagrams of a sample with metal masks under oxidation-dominant condition for 200 seconds in FIG. 3B, 400 seconds in FIG. 3C and 600 seconds in FIG. 3D.

Figure 4:
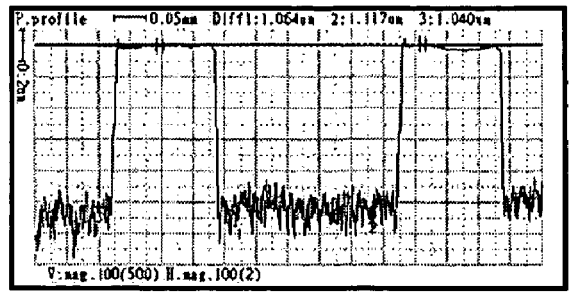
FIG. 4 shows a structure of a vertical-LED wafer with top n-GaN layer.
Figure 4:
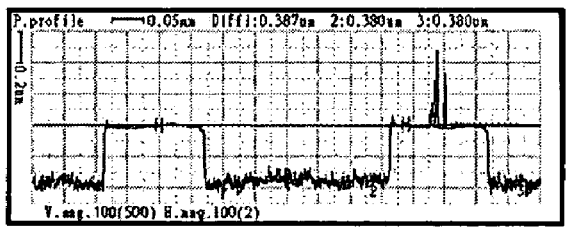
Figure 4:
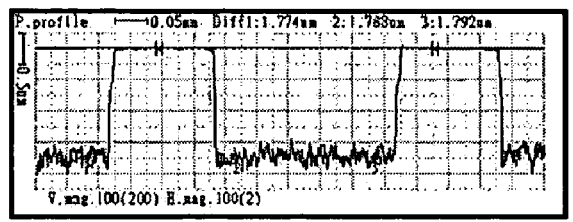
Figure 4:
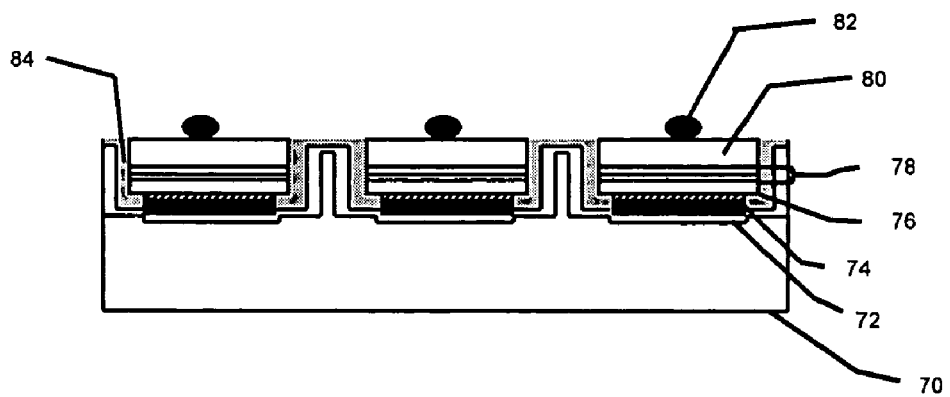

FIG. 4 shows a structure of a vertical-LED wafer. A multi-layer epitaxial structure of an exemplary n-GaN up LED is shown on a metal substrate 70 which can be a thick copper layer in this embodiment. The multi-layer epitaxial structure formed above the metal substrate 70 includes an n-GaN based layer 80, an MQW active layer 78 and a reflector/contact layer 74. The n-GaN based layer 80 has a thickness of 4 microns, for example.

The multi-layer epitaxial layer may be formed by depositing a n-GaN portion (e.g., n-GaN layer 80) above a carrier substrate (not shown), depositing active layers (e.g., MQW active layer 78) above the n-GaN portion, and depositing a p-GaN portion (e.g., p-GaN layer 76) above the active layers, depositing first one or more metal layers (e.g., reflector/contact layer 74), applying a masking layer (not shown), and etching the metal, p-GaN layer, active layers, and n-GaN layer. The masking may then be removed, a passivation layer (e.g., layer 84) deposited, and a portion of the passivation layer on top of the p-GaN removed to expose the first one or more metal layers. Second one or more metal layers (e.g., layer 72) may be deposited, a metal substrate (e.g., metal substrate 70) deposited, the carrier substrate (not shown) removed to expose the n-GaN portion, and the n-GaN portion roughened.

Figure 5:
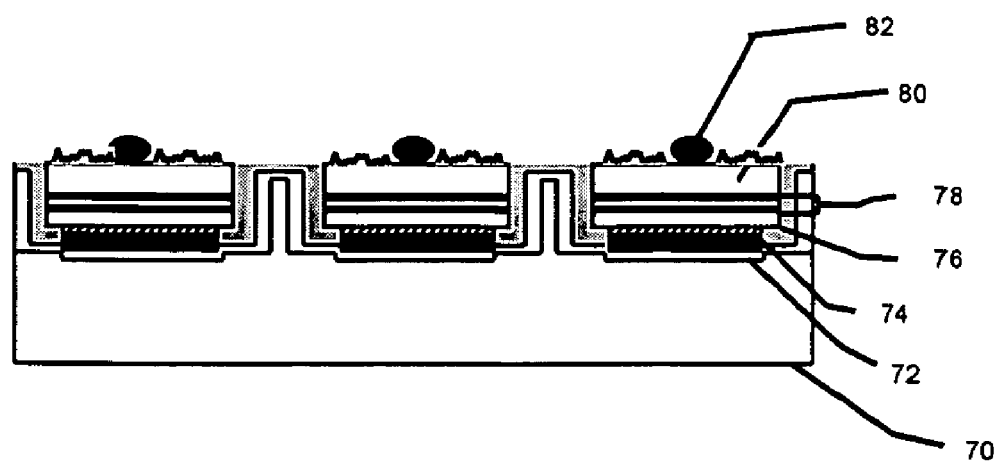
FIG. 5 shows a cross-sectional view of the vertical-LED wafer after the roughening of the exposed n-GaN layer.

The MQW active layer 78 can be an InGaN/GaN MQW active layer. Once electric power is fed between the n-GaN based layer 80 and the contact layer 74, the MQW active layer 78 may be excited and thus generates light. The produced light can have a wavelength between 250 nm to 600 nm. The p-layer 76 can be a $p^+$-GaN based layer, such as a $p^+$-GaN, a $p^+$-AlInGaN or a $p^+$-AlInGaN layer and the thickness thereof may be between 0.05–0.5 microns. FIG. 5 shows a cross-sectional view of the vertical-LED wafer after the roughening process. As show in FIG. 5-FIG. 6, a non-ordered textured morphology is formed on the n-GaN surface.

Figure 6:
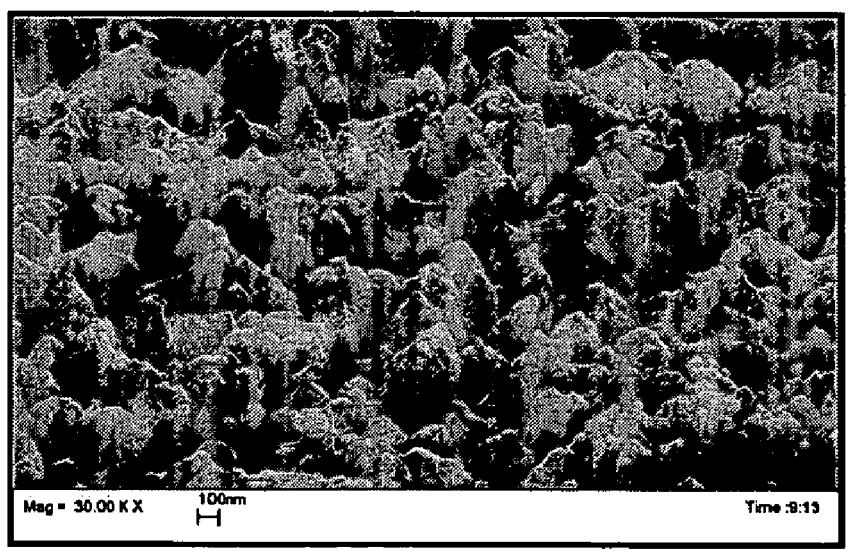
FIG. 6 is an exemplary SEM graph showing a non-ordered textured morphology of the n-GaN surface.

FIG. 5 shows a cross-sectional view of a roughened surface on the metal layer of the LED of FIG. 4, while FIG. 6 shows an exemplary SEM image of the roughened surface. The variations on the surface effectively roughen the surface, and leads to a better matching of the refractive index to air. As a result, the impressions enable better light extraction from the interior of the LED.

Although the present invention has been described in considerable detail with reference to certain preferred embodiments thereof, other versions are possible. In alternative embodiment, the surface of the GaN layer is roughened using balls/spheres or using wet/dry etching techniques. Other LED configurations utilizing the LEE arrays can also be envisioned by one skilled in the art. The new LED can have different combinations of LEE (light extracting element) arrays and disperser layer. LEEs can have different shapes, sizes, spaces between adjacent LEE, and can be placed in different locations. Similarly, the disperser layers can be made of different material and placed in different location. Therefore, the spirit and scope of the appended claims should not be limited to the preferred embodiments described above.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor light emitting diode (LED) device, comprising:

forming an n-gallium nitride (n-GaN) layer on the LED device; and roughening the surface of the n-GaN layer, via a photo-electrochemical (PEC) oxidation and etching method, to form non-ordered textured surfaces to enhance light extraction from an interior of the LED device;

wherein,
the oxidation and etching is performed in a system with: an aqueous solution, an illumination system, and an electrical biased system, the aqueous solution comprises a combination of an oxidizing agent and either acid or alkaline solutions, and the oxidizing agent comprises one or the combination of $H_2O_2$, $K_2S_2O_8$.

2. The method of claim 1, wherein the acid solution comprises one or more of $H_2SO_4$, HF, HCl, $H_3PO_4$, $HNO_3$, and $CH_3COOH$.

3. The method of claim 1, wherein the alkaline solution comprises one or the mixture of KOH, NaOH, and $NH_4OH$.

4. The method of claim 1, further comprising illuminating the LED with an Hg or Xe arc lamp system with wavelength ranging among visible and ultra-violet spectrum.

5. The method of claim 4, wherein the illumination is exposed on the n-GaN with an intensity less than 200 $mW/cm^2$.

6. The method of claim 1, wherein the n-GaN is over a conductive substrate and the method further comprises:
applying an electrical bias to the conductive substrate: and
controlling the voltage between −5 and +5 V.

7. The method of claim 1, further comprising varying the constitution of the aqueous solution, the electrical biased, and the illumination intensity.

8. A method of roughening an exposed n-GaN of an n-side up LED wafer, the method comprising:
depositing an n-GaN portion above a carrier substrate;
depositing active layers above the n-GaN portion;
depositing a p-GaN portion above the active layers;
depositing one or more first metal layers;
applying a masking layer;
etching the first metal layers, the p-GaN portion, the active layers, and the n-GaN portion;
removing the masking layer;
depositing a passivation layer;
removing a portion of the passivation layer on top of the p-GaN portion to expose the first metal layers;
depositing one or more second metal layers;
depositing a metal substrate;
removing the carrier substrate to expose the n-GaN portion; and
roughening the n-GaN portion.

9. The method of claim 8, wherein the n-GaN up LED wafer is substantially smooth and flat before said roughening.

10. The method of claim 9, wherein the n-GaN up LED wafer has a surface roughness of less than 5000 angstrom before said roughening.

11. The method of claim 8, wherein the carrier substrate is sapphire.

12. The method of claim 8, wherein the metal substrate is deposited using one of: electro-chemical plating, electroless chemical plating, sputtering, chemical vapor deposition, e-beam evaporation and thermal spray.

13. The LED wafer of claim 8, wherein the metal substrate is a metal or metal alloy comprising one of Copper, nickel, aluminum, Ti, Ta, Mo, W.

14. The method of claim 8, wherein the carrier substrate is removed using one of: laser lift-off (LLO), wet etching, chemical mechanical polish.

15. The method of claim 8, wherein the roughening process is using one of wet, dry etching, patterning on the n-GaN surface.

16. The method of claim 15, wherein the wet etching is performed using either an acid or alkaline solution.

17. The method of claim 16, wherein the acid solution comprises one or more of $H_2SO_4$, HF, HCl, $H_3PO_4$, $HNO_3$, and $CH_3COOH$.

18. The method of claim 16, wherein the alkaline solution comprises one or the mixture of KOH, NaOH, and $NH_4OH$.

* * * * *